(12) United States Patent
Van Zyl

(10) Patent No.: US 10,263,577 B2
(45) Date of Patent: Apr. 16, 2019

(54) GATE DRIVE CIRCUIT AND METHOD OF OPERATING THE SAME

(71) Applicant: Advanced Energy Industries, Inc., Fort Collins, CO (US)

(72) Inventor: Gideon Johannes Jacobus Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 15/374,242

(22) Filed: Dec. 9, 2016

(65) Prior Publication Data

US 2018/0167043 A1 Jun. 14, 2018

(51) Int. Cl.
| | |
|---|---|
| *H03F 3/04* | (2006.01) |
| *H03F 3/213* | (2006.01) |
| *H03K 3/017* | (2006.01) |
| *H03K 5/08* | (2006.01) |
| *B64C 11/02* | (2006.01) |
| *B64C 11/06* | (2006.01) |
| *B64C 11/32* | (2006.01) |
| *B64C 27/14* | (2006.01) |

(Continued)

(52) U.S. Cl.
CPC .............. *H03F 3/213* (2013.01); *B64C 11/02* (2013.01); *B64C 11/06* (2013.01); *B64C 11/325* (2013.01); *B64C 27/14* (2013.01); *B64C 27/32* (2013.01); *B64C 27/57* (2013.01); *B64C 29/0025* (2013.01); *B64C 39/024* (2013.01); *B64D 35/00* (2013.01); *H03F 3/193* (2013.01); *H03F 3/2171* (2013.01); *H03F 3/265* (2013.01); *H03K 3/017* (2013.01); *H03K 5/08* (2013.01); *H03K 17/0812* (2013.01); *B64C 2201/021* (2013.01); *B64C 2201/024* (2013.01); *B64C 2201/027* (2013.01); *B64C 2201/108* (2013.01); *H03F 2200/222* (2013.01); *H03F 2200/387* (2013.01); *H03F 2200/451* (2013.01); *H03F 2200/534* (2013.01); *H03F 2200/541* (2013.01)

(58) Field of Classification Search
CPC ....... H03F 3/213; H03K 3/017; H03K 17/567
USPC .......... 330/296, 298, 277, 207 P, 124 R, 295
See application file for complete search history.

(56) References Cited

U.S. PATENT DOCUMENTS 9,300,259 B2 * 3/2016 Frohlich ................... H03F 1/34

OTHER PUBLICATIONS

International Searching Authority, International Search Report and Written Opinion, issued for application No. PCT/US2017/065321, dated Mar. 23, 2018 (9 pages).

* cited by examiner

*Primary Examiner* — Khanh V Nguyen
*Assistant Examiner* — Khiem D Nguyen
(74) *Attorney, Agent, or Firm* — Polsinelli PC

(57) ABSTRACT

A gate drive circuit includes a lower limit clamping circuit, an upper limit clamping circuit, and an averaging circuit. The lower limit clamping circuit clamps the input node of a transistor at a minimum voltage with respect to the common node of the transistor, while the upper limit clamping circuit clamps the input node of the transistor at a maximum voltage with respect to the common node of the transistor and the averaging circuit sets the average voltage of the input node with respect to the common node over a specified period of time. The transistor including a common node, an output node and an input node receives the input signal. Controlling the upper limit, lower limit and average value in conjunction with fast transitions between the lower and upper limits controls the duty cycle of the input signal.

22 Claims, 6 Drawing Sheets

(51) Int. Cl.
*B64C 27/32* (2006.01)
*B64C 27/57* (2006.01)
*B64C 29/00* (2006.01)
*B64C 39/02* (2006.01)
*B64D 35/00* (2006.01)
*H03K 17/0812* (2006.01)
*H03F 3/193* (2006.01)
*H03F 3/217* (2006.01)
*H03F 3/26* (2006.01)

GATE DRIVE CIRCUIT AND METHOD OF OPERATING THE SAME

TECHNICAL FIELD

Aspects of the present disclosure relate to amplifiers and, in particular, to a gate drive circuit and method of operating the same.

BACKGROUND

An amplifier is a device that enables an input signal to control power from a source independent of the signal and thus is capable of delivering an output that bears some relationship to, and is generally greater than, the input signal. For power amplifiers the main considerations are output power and efficiency. Most modern power amplifiers use three-terminal solid state devices although vacuum technology is still used. These three terminal devices (e.g. bipolar junction transistors (BJTs), vertical and lateral MOSFETs, IGBTs, GaN HEMTs etc.) are typically used in configurations where one terminal is common between the low power input and high power output, one terminal connects only to the low power input and one terminal connects only to the high power output. For example, for a BJT used in a common emitter configuration, the emitter terminal is the common terminal, whereas the base is connected only to the low power input and the collector connects only to the high power output. For a MOSFET connected in a common source configuration the source is the common terminal, the gate connects only to the low power input and the drain connects only to the high power output. In many cases two physical connections are made to the common terminal to avoid common inductance between the input and output (e.g., Kelvin connection); however, this does not change the characterization of the device as a three terminal device. The output power capability and efficiency of power amplifiers employing three terminal devices are impacted significantly by the ability to provide a well-controlled signal between the input terminal and the common terminal.

SUMMARY

According to one aspect, a gate drive circuit includes a lower limit clamping circuit, an upper limit clamping circuit, and an averaging circuit. The lower limit clamping circuit clamps the input node of a transistor at a minimum voltage with respect to the common node of the transistor, while the upper limit clamping circuit clamps the input node of the transistor at a maximum voltage with respect to the common node of the transistor and the averaging circuit sets the average voltage of the input node with respect to the common node over a specified period of time. The transistor includes a common node, an output node, and an input node to receive the input signal. Controlling the upper limit, lower limit and average value in conjunction with fast transitions between the lower and upper limits controls the duty cycle of the input signal.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

DETAILED DESCRIPTION

Figure 1A:
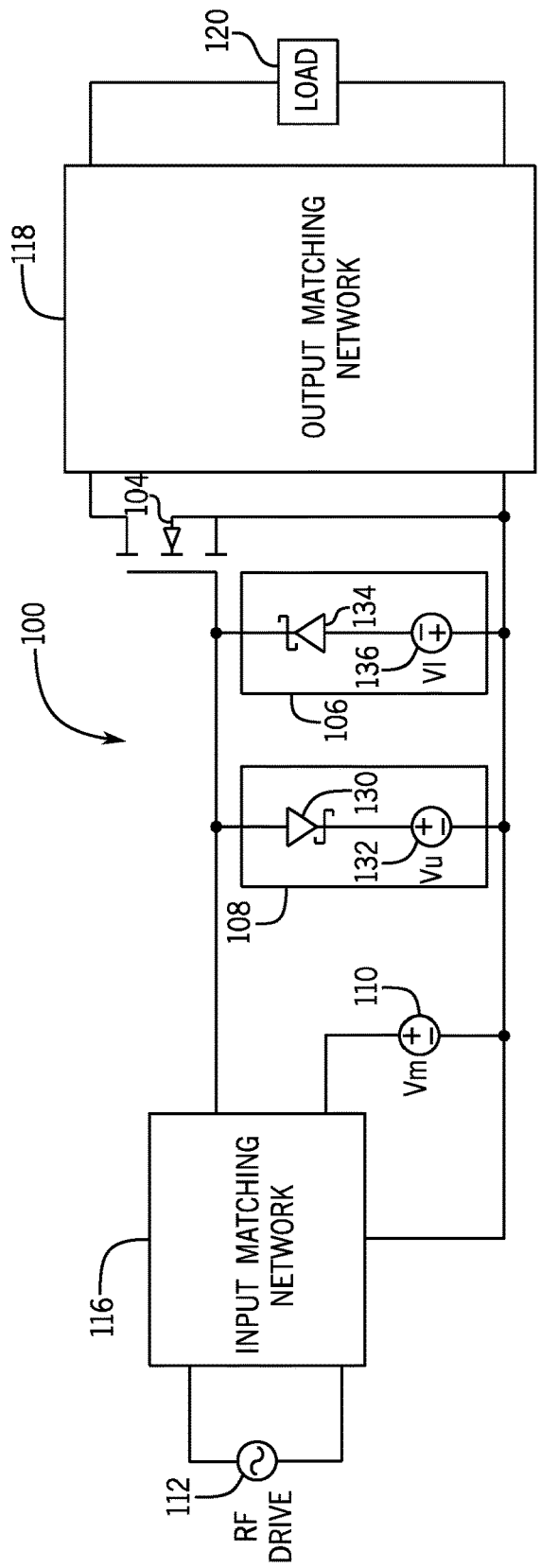
FIGS. 1A and 1B illustrate an example gate drive circuit and associated waveform that may be generated by the gate drive circuit according to one embodiment of the present disclosure.

Embodiments of the present disclosure provide a gate drive circuit for controlling a control signal, including maximum, minimum and average voltage levels that can be applied to an input terminal (e.g., the gate) of a transistor. The control signal from the circuit may provide relatively efficient operation of the transistor at different operating conditions, such as variations in load, variations in operating frequency, variations in ambient environmental conditions, and the like. The gate drive circuit may be particularly useful for certain transistor types, such as Gallium-Nitride (GaN) high-electron-mobility transistor (HEMT) transistors that have input breakdown voltages relatively close to their turn on voltage.

Transistors have been used to implement switching applications where the transistor is operated in its off and saturated states. Switching applications have conventionally been implemented using metal oxide semiconductor field-effect transistor (MOSFET) devices; however, the performance of MOSFETs for these switching applications are inherently limited due to their output equivalent series source to drain resistance compared to device input and output capacitance and ability to dissipate power, which often limits amplifier performance. Embodiments provide a solution to this limitation by providing a gate drive circuit that may enable the use of other transistor designs, such as GaN HEMT devices, whose output equivalent series resistance is lower than its MOSFET counterpart for the same input and output capacitances, thus enabling increased performance.

A high-electron-mobility transistor (HEMT) is a type of field-effect transistor (FET) incorporating a junction between two materials with different band gaps (i.e. a heterojunction) as the channel instead of a doped region as is generally the case for a MOSFET device. A commonly used material combination is GaAs with AlGaAs, GaN with AlGaN, and GaIn with AlGaIn. HEMT devices using GaN have been shown to be advantageous due to their high power performance. Like other FET based devices, HEMTs are used in integrated circuits as digital on-off switches. These HEMTs can also be used as amplifiers for large amounts of current using a small voltage as a control signal. Both of these uses are made possible by the FET's unique current-voltage characteristics.

Conventionally, radio frequency (RF) amplifiers have been developed using MOSFET transistors. However, these MOSFET transistors are limited in their high frequency performance due mainly to their output equivalent series resistance. HEMT transistors have a much lower output equivalent series resistance than their MOSFET counterparts. Due to this feature, HEMT transistors are often fabricated to be physically smaller relative to MOSFETs, which reduces the equivalent output capacitance of the HEMT transistor, which in turn, increases their high frequency performance. Nevertheless, this reduction in size limits the amount of heat that they can dissipate. Thus, use of HEMT transistors should be configured to operate efficiently so that their inherent advantages over conventional MOSFET designs can be realized.

Another challenge of HEMT transistors is their relatively low gate-to-source breakdown voltage levels. For example, a typical gate-to-source breakdown voltage experienced by a HEMT device is approximately ±10.0 volts. To operate the HEMT device efficiently, the gate should be driven to approximately 7.0 volts to turn the HEMT device on, and down to −3.0 volts to turn the HEMT device off. Thus, a relatively narrow voltage range exists for turning the HEMT device on without meeting the breakdown voltages (e.g., 7.0 to 10.0 volts) and turning the HEMT device off (e.g., −3.0 to −10.0 volts). This should be compared to MOSFETS where typical on/off levels for efficient operation is 10/0 volt and breakdown occurs at ±30V.

Figure 1B:
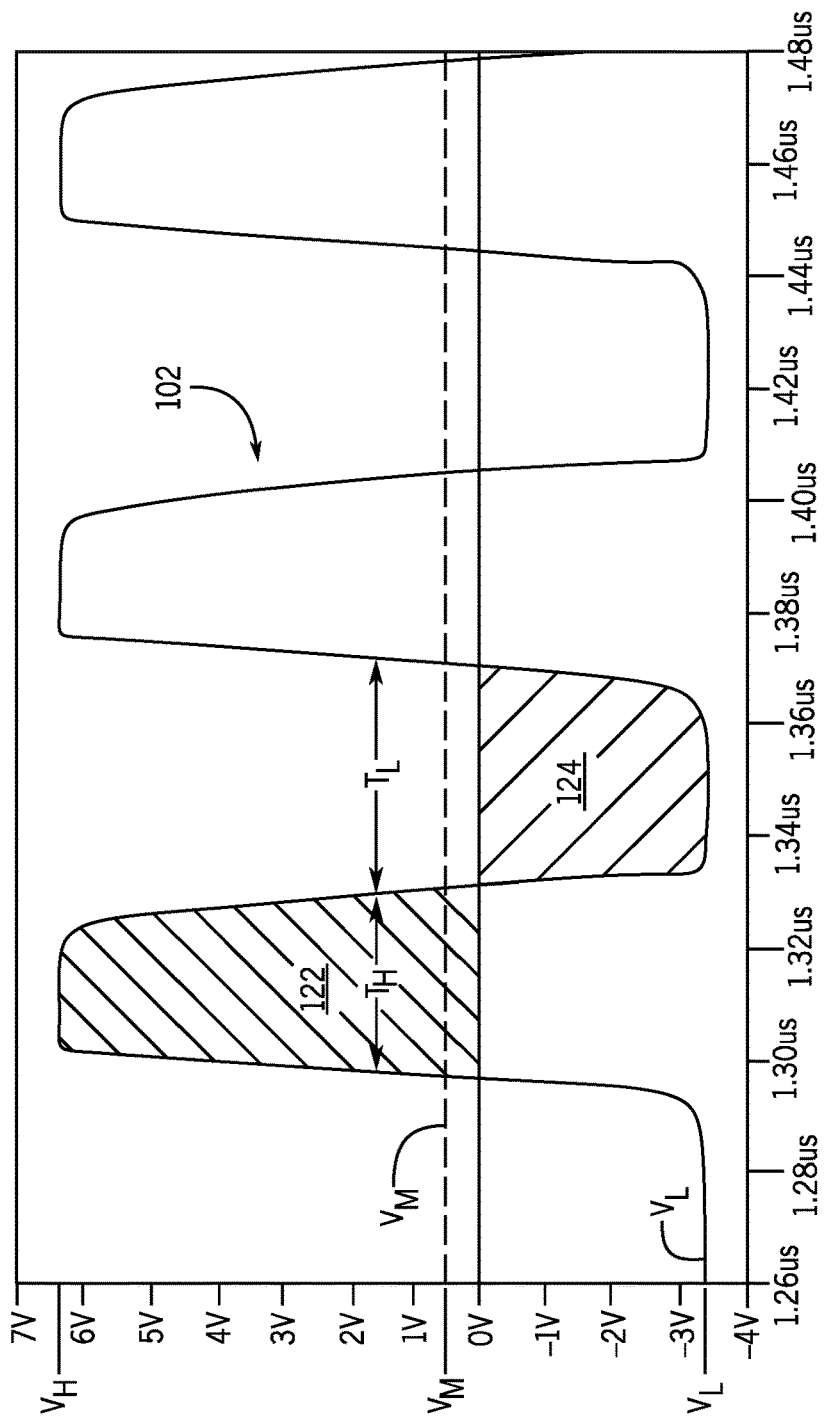

FIGS. 1A and 1B illustrate an example gate drive circuit 100 and associated waveform 102 that may be generated by the gate drive circuit 100 according to one embodiment of the present disclosure. Embodiments of the gate drive circuit 100 may provide a solution to the challenges described above as well as other challenges associated with use of transistors, such as HEMT devices, that may have relatively low gate-to-source breakdown voltages. The gate drive circuit 100 is shown connected to a transistor 104. The gate drive circuit 100 includes a lower limit clamping circuit 106, an upper limit clamping circuit 108, and an averaging circuit 110 coupled together as shown. In particular, the lower limit clamping circuit 106, the upper limit clamping circuit 108, and the averaging circuit 110 are coupled to the input node (e.g., gate) and common node (e.g. source) of the transistor 104 for controlling how the transistor 104 is switched on and off.

As will be described in detail herein below, the lower limit clamping circuit 106 clamps a signal provided by an input signal source 112 to be higher than the negative input to common node (e.g. gate to source) breakdown voltage of the transistor 104, while the upper limit clamping circuit 108 clamps the signal to be less than positive input to common node breakdown voltage of the transistor 104, while the averaging circuit 110 provides a direct current (DC) bias at the input node (e.g., the gate) of the transistor with respect to the common node (e.g. source) so that the average (over time) input to common node voltage is controlled. In one particular example, the transistor 104 may be a HEMT transistor.

Controlling the upper limit, lower limit and average value of the input to common node voltage provides a means of controlling the duty cycle of the transistor. For example, using a upper limit of $V_H$ and a lower limit of $V_L$ and an average value of $V_M$, assuming relatively quick transitions between the lower and upper limits, the fraction of time that the transistor is in the on state (duty cycle, D) assuming the transistor is on when the input to common node voltage is high satisfies the equation $D V_H+(1-D) V_L=V_M$ or $D=(V_M-V_L)/(V_H-V_L)$. For example, targeting a 40% duty cycle with an upper limit of $V_H=6$ and a lower limit of $V_L=-3$ may require an average voltage of $V_M=0.6$ V. In many cases it is convenient to have the average voltage be zero so that the voltage source Vm in FIG. 1A can be replaced by a short circuit. In this case, targeting a 40% duty cycle with $V_H=6$ and $V_M=0$ may require a lower limit of $V_L=-4$ V. Good duty cycle control is essential for the efficient operation of many types of amplifiers. For example, class E amplifiers achieve zero volt switching only if the duty cycle is equal to the design target (typically 50%). For soft switching class D amplifiers it is important to have a well-controlled dead time which in turn can be controlled by controlling the duty cycle of each switch. When the transistor is operated in a zero-volt switching manner efficiency is improved. Additionally the adverse effects of electromagnetic interference (EMI) can also be reduced by zero volt switching, thus enhancing the EMI performance of the amplifier.

In one embodiment, the averaging circuit 110 may generate a DC bias voltage that is adaptable. Changes in the load impedance presented to the amplifier or changes in the required output power may require changes to the input to common node waveform to optimize amplifier performance. Performance optimization may include optimizing efficiency and stability to name two. Thus, the averaging circuit 110 may increase or decrease the DC bias applied to the input of the transistor 104 to ensure optimal operation.

As shown, the gate drive circuit 100 may also include an input matching network 116. The amplifier typically requires an output matching network 118 matching the load 120 to the output of the transistor 104. The output network 118 is assumed to incorporate a power source from which the amplifier draws power to produce output power.

Although the gate drive circuit 100 is shown implemented as an amplifier, including the transistor 104, that amplifies an input signal of the transistor 104 to form an output signal of the transistor 104, which is provided to a load 120, it is contemplated that the gate drive circuit 100 may be implemented with other topologies without departing from the spirit and scope of the present disclosure. For example, the gate drive circuit 100 may be implemented with a switching circuit that is used to drive a brushless direct-current (DC) motor, or a pulse width modulation (PWM) circuit that is used to drive a switch mode power converter.

FIG. 1B illustrates an example waveform 102 of the input signal that can be applied to the input node (e.g., gate) relative to the common node (e.g. source) of the transistor 104 using the gate drive circuit 100 according to one embodiment of the present disclosure. In general, the waveform 102 includes multiple, ongoing high regions 122 where the input signal close to the high limit $V_H$, and multiple, ongoing low regions 124 where the signal is close to the low limit $V_L$. The high regions 122 have a duration $T_H$ representing an amount of time that the input signal is higher than the average value $V_M$, while the low regions 124 have a duration $T_L$ representing an amount of time that the input signal is lower than the average value $V_M$. A duty cycle is defined as $D=T_H/(T_H+T_L)$.

To control the duty cycle to a desired value, the DC bias of the input signal may be increased or decreased by the averaging circuit 110. As shown in this particular example, the upper limit clamping circuit 108 clamps the input voltage at approximately $V_H=6.4$ volt, while the lower limit clamping circuit 106 clamps the input voltage at approximately $V_L=-3.4$ volt. To e.g. achieve a duty cycle of 40%, the average value $V_M$ set by the bias power supply (110, 210, 310, 410 or 510) should be approximately $D V_H+(1-D) V_L=0.4\times 6.4+(1-0.4)\times -3.4=0.52$ V. The word "approximately" is used because approximations are made in assuming that the transition of the signal between $V_L$ and $V_H$ is relatively fast.

Although specific values of example upper limit clamping voltage, a lower limit clamping voltage, and a DC bias offset is shown and described, it should be understood that any suitable level of upper limit clamping voltage, a lower limit clamping voltage, and a DC bias offset may be used without departing from the spirit and scope of the present disclosure. For example, the upper limit clamping voltage, the lower limit clamping voltage, and the DC bias offset may be selected based upon the type of transistor used or one based on a particular type of fabrication process.

The upper limit clamping circuit 108 may include a diode 130 coupled to an upper limit voltage source 132 in which the diode 130 is configured such that it begins to conduct electricity when the input voltage goes above an upper limit voltage level equal to the upper limit voltage source 132 plus the voltage drop across the diode 130. Additionally, the lower limit clamping circuit 106 may include a diode 134 coupled to a lower limit voltage source 136 in which the diode 134 is configured such that it begins to conduct electricity when the input voltage goes below a lower limit voltage level equal to the lower limit voltage source 136 plus the voltage drop across the diode 134. In one embodiment, the diodes 130 and 134 comprise Schottky diodes in which their active elements are made of silicon carbide material.

The upper limit voltage source 132, the lower limit voltage source 136, and the averaging circuit 110 may include any suitable type of components and topological configuration. For example, either or both of the upper limit voltage source 132, the lower limit voltage source 136 and the averaging circuit 110 may include a zener diode coupled in a series configuration with a resistor or be replaced by short circuits. In one embodiment in which the gate drive circuit 100 configured with other circuitry, either of the upper limit voltage source 132 and the lower limit voltage source 136, and the averaging circuit 110 may be used to provide electrical power for one or more other components of the other circuitry to enhance the efficiency of the overall circuit. The clamping sources 132 and 136 in general only absorb power and this power can be recycled or dissipated. The bias source 110 can either deliver or absorb power and when set to zero volt may be replaced by a short circuit thus neither delivering nor absorbing power.

Figure 2:
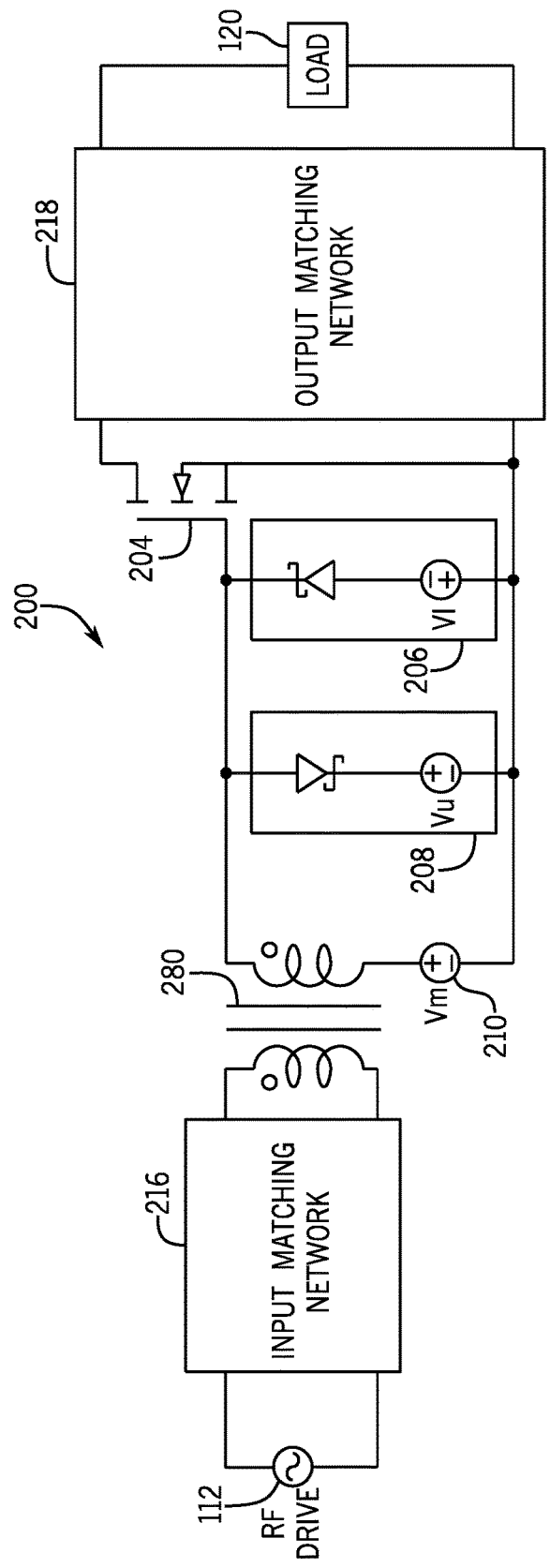
FIG. 2 illustrates another example gate drive circuit according to one embodiment of the present disclosure.

FIG. 2 illustrates another example gate drive circuit 200 according to another embodiment of the present disclosure. The gate drive circuit 200, when connected with a transistor 204, forms an amplifier. The gate drive circuit 200 includes a lower limit clamping circuit 206, an upper limit clamping circuit 208, an averaging circuit 210, an input matching network 216, and an output matching network 218 that are connected and operate as shown and described above with reference to the gate drive circuit 100 of FIG. 1. The gate drive circuit 200 of FIG. 2 differs, however, in that it includes a transformer 280 coupling the input signal source 112 to the input node of the transistor 204. The transformer 280 may be included to isolate any DC bias present on the input signal from being propagated to the gate drive circuit 200. Thus, the transformer 280 may enhance the immunity of the DC bias provided by the averaging circuit from occasional perturbations that would otherwise adversely affect the ability of the averaging circuit 210 from maintaining the desired duty cycle.

Figure 3:
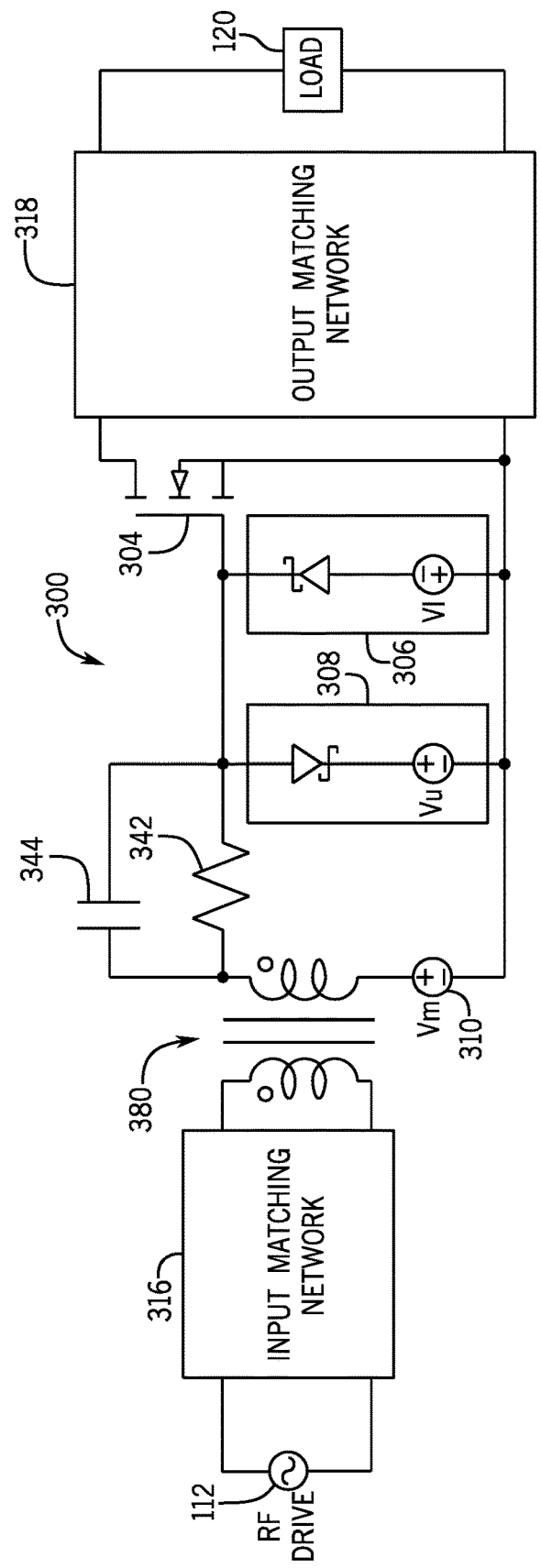
FIG. 3 illustrates another example gate drive circuit according to one embodiment of the present disclosure.

FIG. 3 illustrates another example gate drive circuit 300 according to another embodiment of the present disclosure. The gate drive circuit 300, when connected with a transistor 304, forms an amplifier. The gate drive circuit 300 includes a transistor 304, a lower limit clamping circuit 306, an upper limit clamping circuit 308, an averaging circuit 310, an input matching network 316, an output matching network 318, and a transformer 380 that are connected and operate as shown and described above with reference to the gate drive circuit 200 of FIG. 2. The gate drive circuit 300 of FIG. 3 differs, however, in that it includes a resistor 342 and a capacitor 344 coupled between the averaging circuit 310 and the input (e.g., gate) of the transistor 304.

The resistor 342 may be included to dampen the amplitude of the input signal provided to the input of the transistor 304. That is, the resistor 342 may improve the performance of the gate drive circuit 300 by limiting excessive input signal amplitude, which could otherwise overdrive the input of the transistor 304. In essence, the resistor 342 may effect a tradeoff between precisely controlling the transient on and off times of the transistor 304 for improved input overdrive suppression.

The capacitor 344 may be included to provide a high-pass filter between the input signal source 112 and the transistor 304 such that the RF components from the input signal source 112 are accentuated while its DC component is suppressed. In some cases, the capacitance of the capacitor 344 and the resistance of the resistor 342 may be selected to tailor the performance characteristics of the gate drive circuit 300, such as an expected frequency range that the gate drive circuit 300 is to function in, an input impedance range of the input signal source 112, or an expected output impedance range of the load 120.

Figure 4:
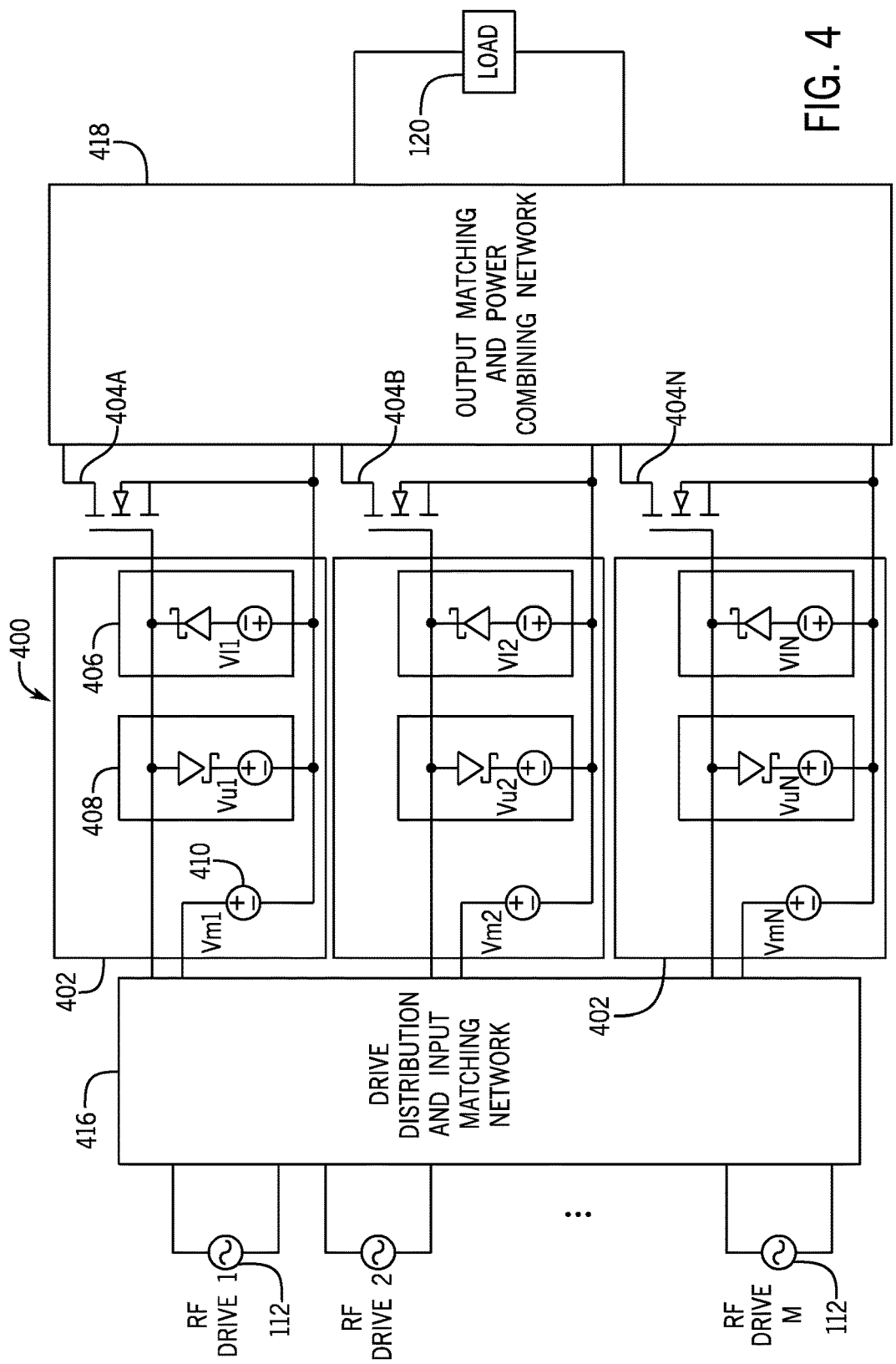
FIG. 4 illustrates another example gate drive circuit according to one embodiment of the present disclosure.

FIG. 4 illustrates another example gate drive circuit 400 according to another embodiment of the present disclosure. The gate drive circuit 400 includes multiple gate drive circuits 402, each providing an input signal to a transistor 404, a lower limit clamping circuit 406, an upper limit clamping circuit 408, an averaging circuit 410, that are each connected and operate as shown and described above with reference to the gate drive circuit 100 of FIG. 1. The gate drive circuit 400 of FIG. 4 differs, however, in that it includes a drive distribution and input matching network 416 coupling multiple input signal sources 112 to the input of the transistor 404 of each gate drive circuit 402, and an output matching and power combining network 418 coupling the transistors 404 to a load 120.

The drive distribution and input matching network 416 matches the output impedance of each of the input signal sources 112 with the input impedance of the gate drive circuits 402. In some cases, the drive distribution and input matching network 416 may also be included to isolate any DC bias present on the input signals from being propagated to each gate drive circuit 400. The output matching and power combining network 418, on the other hand, matches the output impedance of each of the transistors 404 with the impedance of the load 120, and may also provide for isolation of any DC bias present on the transistors 404 from being propagated to the load 120.

Such a configuration may be useful for providing relatively larger amplification than what could otherwise be provided by a single gate drive configuration. For example, it may be beneficial to integrally form one or more HEMT devices on a common integrated substrate. However, when the HEMT devices are configured in such a manner, their size may be limited due to their heat dissipating capabilities, thus limiting the power transfer capabilities provided by a single HEMT device. Embodiments of the present disclosure may provide a solution to this problem via the implementation of a drive distribution and input matching network 416 and a output matching and power combining network 418 that can combine the power transfer characteristics of multiple HEMT devices so that the overall power transfer characteristics are enhanced.

Figure 5:
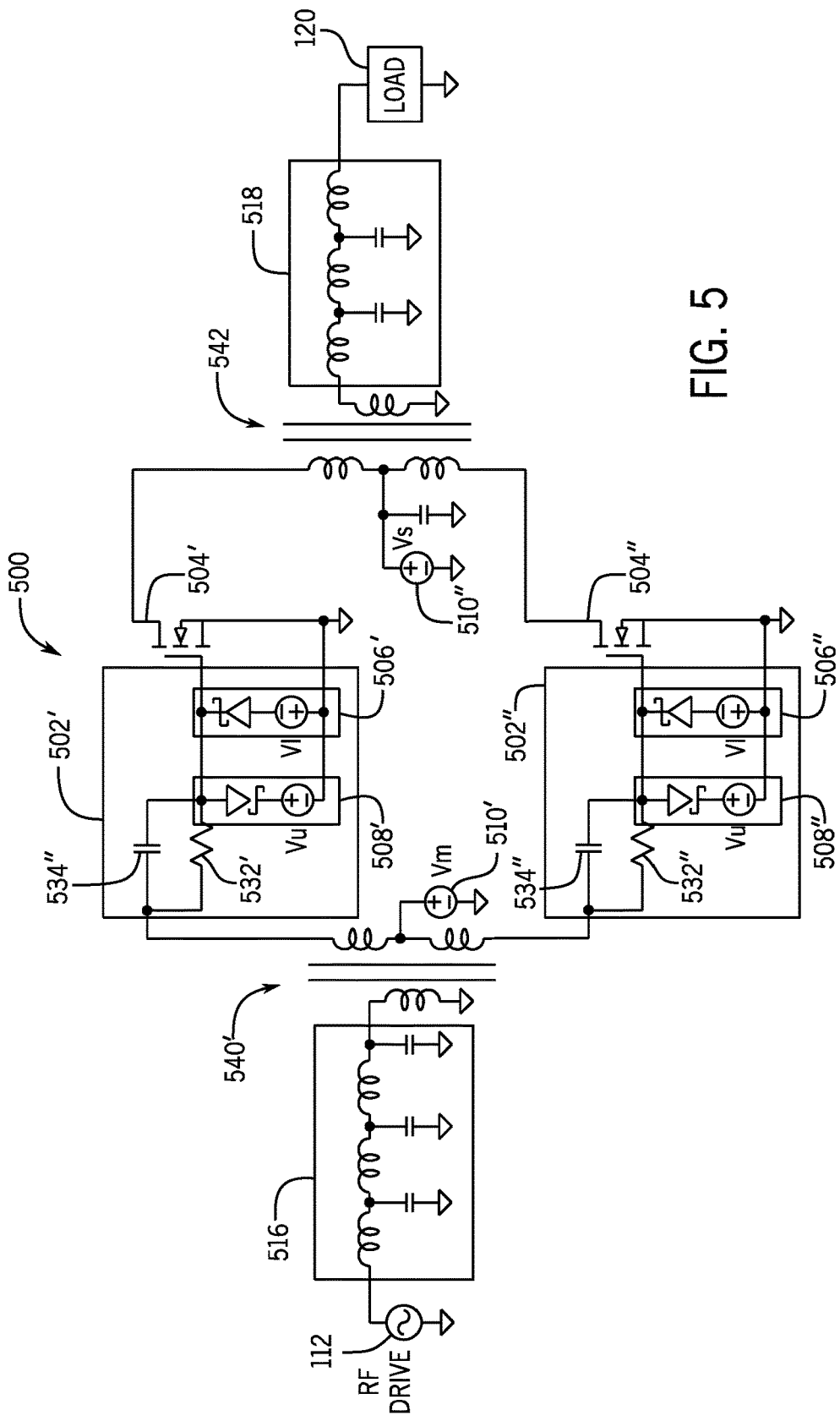
FIG. 5 illustrates an example implementation of two gate drive circuits to form an amplifier according to one embodiment of the present disclosure.

FIG. 5 illustrates an example implementation of two gate drive circuits to form an amplifier 500 having a push-pull configuration according to another embodiment of the present disclosure. The amplifier 500 includes a first gate drive circuit 502' and a second gate drive circuit 502", respective transistors 504' and 504", an input matching network 516, an input transformer 540, an output transformer 542, and an output matching network 518 coupled together as shown. The amplifier 500 as shown may be operated in any suitable mode, such as in a class B, C, D, E and/or F mode of operation.

The gate drive circuit 502' includes a lower limit clamping circuit 506', an upper limit clamping circuit 508', a resistor 532', and a capacitor 534', that are coupled to a transistor 504'. The gate drive circuit 502" includes a lower limit clamping circuit 506", an upper limit clamping circuit 508", a resistor 532", and a capacitor 534", that are coupled to a transistor 504". The input averaging source 510' is common to both gate drive circuits.

As shown, each of the input averaging circuit 510' and the power supply 510" comprises a voltage source; nevertheless, it should be understood that the each of the input averaging circuit 510' and the power supply 510" may include any suitable type and number of components without departing from the spirit and scope of the present disclosure, including replacing 510' with a short circuit.

According to one embodiment of the present disclosure, the transistor duty cycles as controlled by the input matching circuits 502', 502" and averaging source 510' together with the choice of properties of the various other components (e.g. magnetizing inductance of the output transformer 542) maintain zero-volt switching for the transistors 504' and 504" for the range of loads 120 and power levels delivered to those loads. To achieve this for all combinations of load and power levels into those loads the averaging source 510' may be adjusted.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A gate drive circuit comprising:
a drive signal input;
a lower limit clamping circuit coupled to an input node and a common node of a transistor including an output node, the input node coupled to the drive signal input that receives an input signal at a duty cycle to be applied between the input node and the common node, the lower limit clamping circuit clamping the input node of the transistor at a minimum voltage with respect to the common node of the transistor, the lower limit clamping circuit comprises a first diode coupled between a first source and the input node;
an upper limit clamping circuit coupled to the input node and the common node of the transistor, the upper limit clamping circuit clamping the input node of the transistor at a maximum voltage with respect to the common node, the upper limit clamping circuit comprises a second diode coupled between a second source and the input node; and
an averaging circuit coupled to the input node and the common node of the transistor, the averaging circuit providing a direct current bias at the input node of the transistor to set an average voltage of the input signal received at the input node with respect to the common node.

2. The gate drive circuit of claim 1, wherein the input signal comprises a sinusoidal signal, and the gate drive circuit comprises a portion of an amplifier.

3. The gate drive circuit of claim 1, wherein the transistor comprises a gallium Nitride (GaN) high electron mobility transistor (HEMT) device, and wherein the input node comprises a gate of the GaN HEMT device.

4. The gate drive circuit of claim 1, wherein the gate drive circuit comprises a portion of another circuit, at least one of the first source or the second source is used to power the portion of the another circuit.

5. A gate drive circuit comprising:
a drive signal input;
a lower limit clamping circuit coupled to an input node and a common node of a transistor including an output node, the input node coupled to the drive signal input that receives an input signal at a duty cycle to be applied between the input node and the common node, the lower limit clamping circuit clamping the input node of the transistor at a minimum voltage with respect to the common node of the transistor;
an upper limit clamping circuit coupled to the input node and the common node of the transistor, the upper limit clamping circuit clamping the input node of the transistor at a maximum voltage with respect to the common node;
an averaging circuit providing a direct current bias at the input node of the transistor to set an average voltage of the input signal received at the input node with respect to the common node; and
a transformer coupled between the input node of the transistor and the drive signal input, the transformer to isolate a bias of the input signal from the direct current bias provided by the averaging circuit.

6. The gate drive circuit of claim 1, further comprising a resistor coupled between the averaging circuit and the input node of the transistor, the resistor dampening an amplitude of the input signal provided to the input node of the transistor.

7. The gate drive circuit of claim 1, further comprising a capacitor coupled between the averaging circuit and the input node of the transistor, the capacitor bypassing an alternating-current (AC) component of the input signal provided to the input node of the transistor.

8. A plurality of the gate drive circuits of claim 1 configured in an amplifier, the drive signal inputs of each gate drive circuit coupled to the input signal through a drive distribution and input matching network, the output node of each transistor coupled to a load through an output matching and power combining network.

9. The gate drive circuit of claim 1, wherein the averaging circuit comprises a third direct current source to apply a direct current (DC) bias to the input signal to adjust a zero volt crossing point of the input signal.

10. A gate driving method comprising:
receiving an input signal at a frequency and providing an amplified output signal by at least one transistor having an input node, a common node and an output node;
clamping the input node of the transistor at a minimum voltage with respect to the common node of the transistor using a lower limit clamping circuit coupled to the input node and the common node of the transistor, the lower limit clamping circuit comprises a first diode coupled between a first source and the input node;
clamping the input node of the transistor at a maximum voltage with respect to the common node of the transistor using an upper limit clamping circuit coupled to the input node and common node of the transistor, the upper limit clamping circuit comprises a second diode coupled between a second source and the input node; and
providing a direct current bias at the input node of the transistor.

11. The gate driving method of claim 10, further comprising driving the input signal with a sinusoidal signal.

12. The gate driving method of claim 10, further comprising isolating a bias of the input signal from the direct current bias using a transformer coupled between the input node of the transistor and the input signal.

13. The gate driving method of claim 10, further comprising dampening an amplitude of the input signal provided to the input node of the transistor using a resistor coupled in series with the input node of the transistor.

14. The gate driving method of claim 13, further comprising bypassing an alternating-current (AC) component of the input signal provided to the input node of the transistor using a capacitor coupled in parallel with the resistor.

15. An electrical circuit comprising:
an amplifier comprising:
a lower limit clamping circuit comprising a first direct current (DC) source coupled to a first diode, the first diode coupled to an input node of a transistor including an input node, a common node and an output node, the input node to receive an input signal at a frequency and provide an amplified output signal at the output node, the lower limit clamping circuit clamping the input node of the transistor at a minimum voltage with respect to the common node of the transistor;
an upper limit clamping circuit comprising a second DC source coupled to a second diode, the second diode coupled to the input node of the transistor, the upper limit clamping circuit clamping the input node of the transistor at a maximum voltage with respect to the common node of the transistor; and
an averaging circuit comprising a third DC source coupled to the input node of the transistor, the averaging circuit providing a direct current bias at the input node of the transistor.

16. The electrical circuit of claim 15, wherein the transistor comprises a gallium Nitride (GaN) high electron mobility transistor (HEMT) device, and wherein the input node comprises a gate of the GaN HEMT device.

17. The electrical circuit of claim 15, wherein the amplifier further comprises a transformer coupled between the input node of the transistor and the input signal, the transformer to isolate a bias of the input signal from the direct current bias provided by the averaging circuit.

18. The electrical circuit of claim 15, wherein the amplifier further comprises a resistor coupled between the averaging circuit and the input node of the transistor, the resistor dampening an amplitude of the input signal provided to the input node of the transistor.

19. The electrical circuit of claim 15, wherein the amplifier further comprises a capacitor coupled between the averaging circuit and the input node of the transistor, the capacitor bypassing an AC component of the input signal provided to the input node of the transistor.

20. The gate drive circuit of claim 3 wherein the minimum voltage and the maximum voltage are set to operate the GaN HEMT device without meeting a gate to source breakdown voltage of the GaN HEMT device, and the direct current bias at the input node of the transistor to set the average voltage of the input signal received at the input node to control the duty cycle.

21. The electrical circuit of claim 16 wherein the minimum voltage and the maximum voltage are set to operate the GaN HEMT device without meeting a gate to source breakdown voltage of the GaN HEMT device.

22. The gate drive circuit of claim 5, wherein the lower limit clamping circuit comprises a first diode coupled between a first direct current (DC) source and the input node, and the upper limit clamping circuit comprises a second diode coupled between a second direct current (DC) source and the input node.

* * * * *